US008576648B2

(12) United States Patent
Markov et al.

(10) Patent No.: US 8,576,648 B2
(45) Date of Patent: Nov. 5, 2013

(54) METHOD OF TESTING DATA RETENTION OF A NON-VOLATILE MEMORY CELL HAVING A FLOATING GATE

(75) Inventors: Viktor Markov, Sunnyvale, CA (US); Jong-Won Yoo, Cupertino, CA (US); Satish Bansal, Milpitas, CA (US); Alexander Kotov, Sunnyvale, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 75 days.

(21) Appl. No.: 13/293,056

(22) Filed: Nov. 9, 2011

(65) Prior Publication Data

US 2013/0114337 A1   May 9, 2013

(51) Int. Cl.
*G11C 7/00* (2006.01)
*G11C 29/50* (2006.01)

(52) U.S. Cl.
CPC .................................... *G11C 29/50* (2013.01)
USPC ................ 365/201; 365/185.01; 365/185.29; 365/185.3; 365/185.26; 365/185.23

(58) Field of Classification Search
CPC ...................................................... G11C 29/50
USPC ..................... 365/201, 185.01, 185.29, 185.3, 365/185.26, 185.23
See application file for complete search history.

(56) References Cited

U.S. PATENT DOCUMENTS

| | | | |
|---|---|---|---|
| 4,809,231 A * | 2/1989 | Shannon et al. | ............... 365/201 |
| 2002/0036925 A1 | 3/2002 | Tanzawa et al. | |
| 2004/0049724 A1 | 3/2004 | Bill et al. | |
| 2005/0035429 A1 | 2/2005 | Yeh et al. | |
| 2006/0227601 A1 | 10/2006 | Bhattacharyya | |
| 2008/0268659 A1 | 10/2008 | Wu et al. | |
| 2009/0045452 A1 | 2/2009 | Lue et al. | |
| 2009/0073760 A1 | 3/2009 | Betser et al. | |

OTHER PUBLICATIONS

PCT International Search Report of PCT/US12/61386; dated Jan. 7, 2013.
PCT Written Opinion of the International Searching Authority of PCT/US12/61386; dated Jan. 7, 20113.
Bez, et al. 'Introduction to Flash Memory'. In Proceedings of the IEEE, vol. 91, No. 4, Published Apr. 2003, p. 489-502. [retrieved on Dec. 6, 2012]. Retrieved from the Internet <URL:http://www-micro.deis.unibo.it/~romani/Dida01/1ezioni/flsh_proc_ieee.pdf> entire document, especially Abstract; Figs. 10A, 10C, 10D, 21; p. 492, col. 2; p. 493, col. 1; p. 495, col. 1; p. 496, col. 1; p. 497, col. 2; p. 498, col. 2.

(Continued)

*Primary Examiner* — Thong Q Le
(74) *Attorney, Agent, or Firm* — DLA Piper LLP (US)

(57) ABSTRACT

A method of decreasing the test time to determine data retention (e.g. leakage current) of a memory cell having a floating gate for the storage of charges thereon. The memory cell is characterized by the leakage current having a rate of leakage which is dependent upon the absolute value of the voltage of the floating gate. The memory cell is further characterized by a first erase voltage and a first programming voltage, applied during normal operation, and a first read current detected during normal operation. The method applies a voltage greater than the first erase voltage or greater than the first programming voltage, to over erase the floating gate. The memory cell including the floating gate is subject to a single high temperature bake. The memory cell is then tested for data retention of the floating gate based on the single high temperature bake.

6 Claims, 2 Drawing Sheets

(56) References Cited

OTHER PUBLICATIONS

Bloom et al. 'NROM™—a new non-volatile memory technology: from device to products'. In Microelectronic Engineering, vol. 46, No. 11, p. 213-223. Published Nov. 2002. [retrieved on Dec. 6, 2012]. Retrieved from the Internet <URL :http://144.206.159.178/FT/7744/46181/821057.pdf> entire document.

Citation depicting publication data: Bloom et al. 'NORM™—a new non-volatile memory technology: from device to products'. In Microelectronic Engineering, vol. 46, No. 11, p. 213-223. Published Nov. 2002. [retrieved on Dec. 6, 2012]. Retrieved from the Internet <URL:http://www.sciencedirect.com/science/article/pii/S0038110102001454>.

\* cited by examiner

METHOD OF TESTING DATA RETENTION OF A NON-VOLATILE MEMORY CELL HAVING A FLOATING GATE

TECHNICAL FIELD

The present invention relates to a method of testing a non-volatile memory cell having a floating gate for data retention and more particularly to a method requiring only one baking step.

BACKGROUND OF THE INVENTION

Non-volatile memory cells having a floating gate for the storage of charges thereon are well known in the art. Referring to FIG. 1 there is shown a cross-sectional view of a non-volatile memory cell 10 of the prior art. The memory cell 10 comprises a single crystalline substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by an silicon (di)oxide layer 22. Immediately adjacent to and spaced apart from the word line 20 is a floating gate 24, which is also made of polysilicon, and is positioned over another portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and to another side of the coupling gate 26. In the operation of the memory cell 10, charges stored on the floating gate 24 (or the absence of charges on the floating gate 24) control the flow of current between the first region 14 and the second region 16. Where the floating gate 24 has charges thereon, the floating gate 24 is programmed. Where the floating gate 24 does not have charges thereon, the floating gate 24 is erased.

The memory cell 10 operates as follows. During the programming operation, when charges are stored on the floating gate 24, a first positive voltage is applied to the word line 20 causing the portion of the channel region 18 under the word line 20 to be conductive. A second positive voltage is applied to the coupling gate 26. A third positive voltage is applied to the second region 16. Current is applied to the first region 14. The electrons are attracted to the positive voltage at the second region 16. As they near the floating gate 24, they experience a sudden increase in the electric field caused by the voltage applied to the coupling gate 26, causing the charges to be injected onto the floating gate 24. Thus, programming occurs through the mechanism of hot electron injection. During the erase operation when charges are removed from the floating gate 24, a high positive voltage is applied to the erase gate 28. A negative voltage or ground voltage can be applied to the coupling gate 26 and/or the word line 20. Charges are transferred from the floating gate 24 to the erase gate 28 by tunneling through the insulating layer between the floating gate 24 and the erase gate 28. In particular, the floating gate 24 may be formed with a sharp tip facing the erase gate 28, thereby facilitating the Fowler-Nordheim tunneling of electrons from the tip on the floating gate 24 and through the insulating layer between the floating gate 24 and the erase gate 28 onto the erase gate 28. During the read operation, a first positive voltage is applied to the word line 20 to turn on the portion of the channel region 18 beneath the word line 20. A second positive voltage is applied to the coupling gate 26. A voltage differential is applied to the first region 14 and the second region 16. If the floating gate 24 were programmed, i.e. the floating gate 24 stores electrons, then the second positive voltage applied to the coupling gate 26 is not able to overcome the negative potential induced by electrons stored on the floating gate 24 and the portion of the channel region 18 beneath the floating gate 24 remains non-conductive. Thus, no current or a minimal amount of current would flow between the first region 14 and the second region 16. However, if the floating gate 24 were not programmed, i.e. the floating gate 24 is positively charged, then the second positive voltage applied to the coupling gate 26 is able to cause the portion of the channel region 18 beneath the floating gate 24 to be conductive. Thus, a current would flow between the first region 14 and the second region 16.

As is well known, memory cells 10 are typically formed in an array, having a plurality of rows and columns of memory cells 10, on a semiconductor wafer. After the devices are fabricated on a wafer, the devices on the wafer are subject to a test to determine the ability of each memory cell 10 to retain its programmed or erased state, in particular, the ability of the floating gate 24 in each memory cell 10 to retain its charge. During testing the memory cell 10 is first programmed, to place charges on the floating gate 24, or erased, to remove charges from the floating gate 24. The device is then subject to a high temperature bake. Finally, each memory cell 10 in the device is subject to a read operation in which the read current from the memory cell 10 under test is compared to the read reference current.

Referring to FIG. 2 there is shown a graph of the read current of various memory cells with their data. The cells with the erased state typically would have a higher read current 40 compared to the read current 42 from memory cells with zero charge on the floating gates, which typically have a higher current than the read current 44 from the programmed memory cells. Due to dispersion of parameters of cell integrated in a memory array, the read current 42 of some cells can be higher than the read reference current, and the read current 42 of some cells can be lower than the read reference current.

In the event the memory cell 10 has a leakage path for charge through dielectrics surrounding floating gate 24, the read current from such a defective memory cell 10 having an erased state, would decrease and tend to have the characteristics of current 42. This condition cannot be detected after a high temperature bake if the read current from the defective memory cell 10 under test remains above the read reference current. Similarly, the read current from a defective memory cell 10 having a programmed state, would increase and tend to have the characteristics of current 42. This condition cannot be detected after a high temperature bake if the read current from a defective memory cell 10 under test remains below the read reference current.

Due to these characteristics of the non-volatile memory cell 10, testing of a memory device with memory cells 10 of the prior art have involved two steps. In a first step, a first data pattern is stored in all memory devices followed by a first baking step, followed by a testing step to determine the read current of each memory cell 10 and compare them to the read reference current. In a second step a second data pattern, which is a mutually inverse pattern of the first data pattern, is stored in all memory devices followed by a second baking step, followed by a testing step to determine the read current of each memory cell 10 and compare them to the read reference current. Because the time to store the data pattern in all memory devices and the time to bake the devices is considerable, this has increased the cost of testing the memory device. Even with the two baking process of the prior art, however, some defective memory cells 10 may be undetected after the data retention screening tests. For example, a defective cell 10 has a read current 42 above the read reference current. In the first test, when the defective cell 10 is in the erased state, the read current from such a cell would decrease and tend to have the characteristics of current 42, so that its read current remains above the read reference current, and the defective cell 10 would not be detected. In the second test, when the defective cell 10 is in the programmed state, the read current from such a cell would increase and tend to have the characteristics of the read current 42. However, if leakage is too slow during the bake process, the read current from the defective cell 10 would not have time to increase above the read reference current during the baking process. Therefore, because the read reference current is typically close to the read current 42, leakage during baking process is typically slow and some defective cells 10 may remain undetected after data retention screening.

SUMMARY OF THE INVENTION

Thus, one object of the present invention is to decrease the test time to determine data retention of a memory cell having a floating gate for the storage of charges thereon to determine if the memory cell has a leakage current from the floating gate. The memory cell which has a leak from the floating gate is characterized by the leakage current which is dependent upon the absolute value of the voltage of the floating gate. The memory cell is characterized by a first erase voltage and a first programming voltage, applied during normal operation, and a first read current detected during normal operation. In the method of the present invention, the method applies a voltage greater than the first erase voltage to over erase the floating gate. The memory cell including the floating gate is subject to a single high temperature bake. The memory cell is then tested for data retention of the floating gate based on the single high temperature bake.

In another embodiment of the present invention, the method applies a voltage greater than the first programming voltage to over program the floating gate. The memory cell including the floating gate is subject to a single high temperature bake. The memory cell is then tested for data retention of the floating gate based on the single high temperature bake.

DETAILED DESCRIPTION OF THE PREFERRED EMBODIMENT

Figure 1:
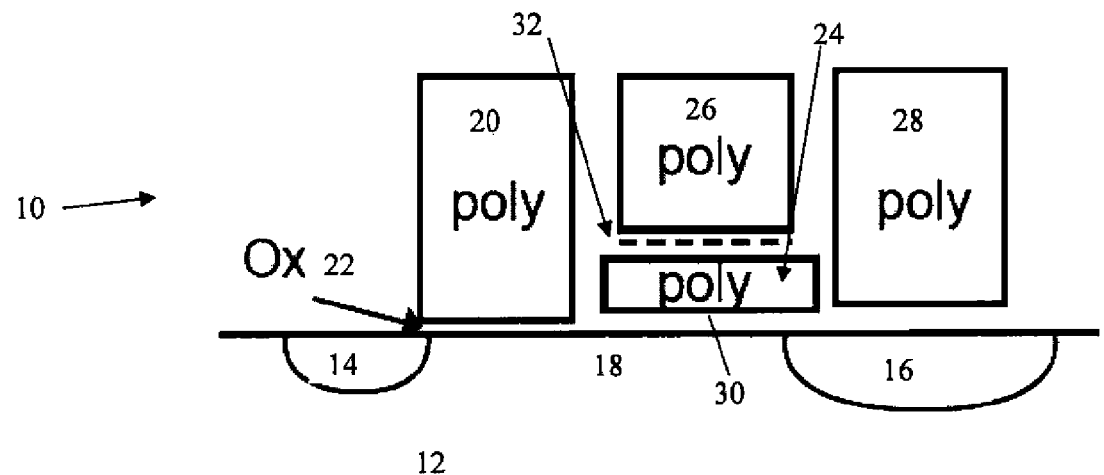
FIG. 1 is a cross-sectional view of a non-volatile memory cell of the prior art with a floating gate for the storage of charges thereon to which the method of the present invention of testing is applicable.
Figure 2:
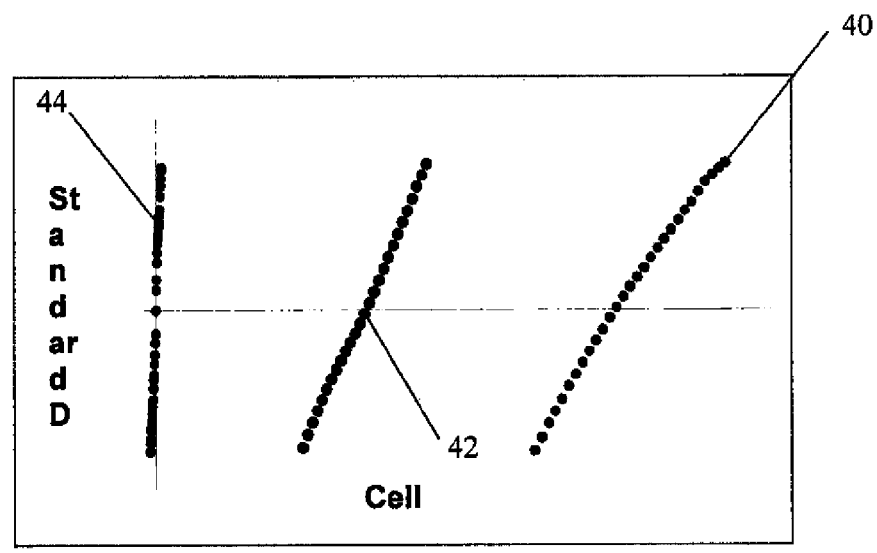
FIG. 2 are graphs showing the distributions of read current of erased memory cells, memory cells with zero charge on floating gate, and programmed memory cells.

The method of the present invention to improve the testing of data retention can be applied to all floating gate non-volatile memory cells and in particular those non-volatile memory cells 10 shown in FIG. 1. As will be seen hereinafter, the method of the present invention has particular application to a floating gate non-volatile memory cell that has a leakage that is dependent upon the absolute value of the voltage programmed or erased on the floating gate.

Figure 3:
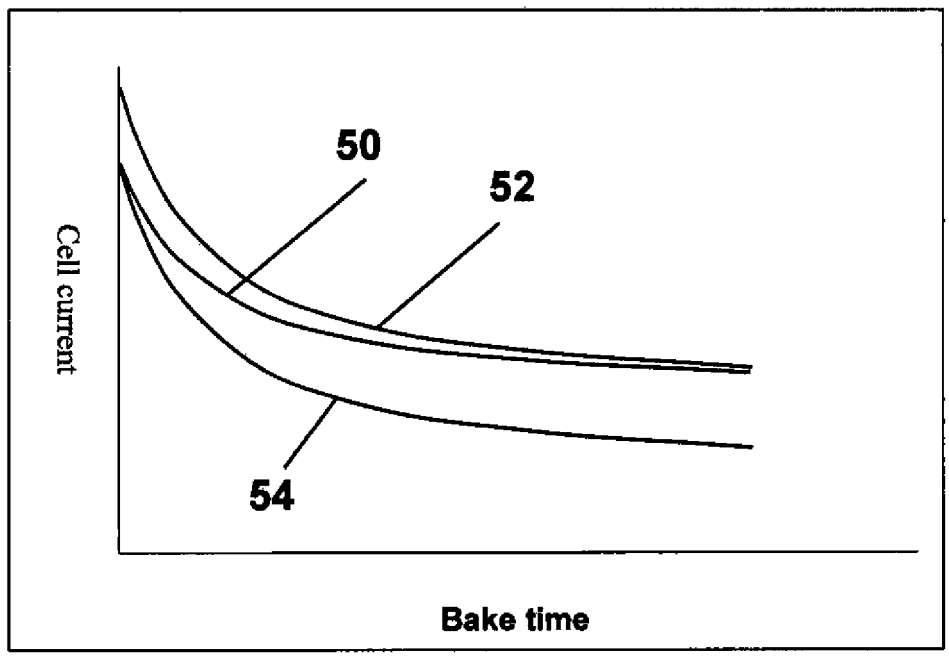
FIG. 3 are graphs showing the read current as a function of time, of a memory cell having a leak from the floating gate, erased to a "normal" erase voltage, and over erased to a higher erase voltage, and as a function of a lower read voltage.

Referring to FIG. 3 there is shown a graph 50 of a floating gate memory cell 10 which was erased with "normal" erase voltage, with its read current as a function of time. By "normal" erase voltage it is meant the voltage that is used when the memory cell 10 is erased in operation. The graph 50 shows that as the memory cell 10 is baked over time, the read current decreases, asymptotically, and tends to have a value which corresponds to zero charge on the floating gate 24. As is typical of a memory cell 10 that is in an erased state, the initial read current is large. However, due to the leakage, the floating gate 24 loses positive charge, so the read current decreases over time. It has been discovered that the leakage rate depends on the voltage on the floating gate 24. Therefore, if the erase voltage is increased so that it is greater than the "normal" erase voltage, and with the same leakage in memory cell 10, the graph 52 of the read current as a function of time would result. As can be seen from the graphs shown in FIG. 3, because the speed of the decrease in the read current depends on the voltage on the floating gate 24, by over-erasing the memory cell 10 and baking the memory cell 10, the read current of a defective cell 10 would decrease faster than in the case of "normal" erase. After the memory cell 10 is over-erased, a lower voltage or even zero or negative voltage is applied to the coupling gate 26 to sense the read current. The use of lower read voltage would result in lower read current and the graph 54 of the read current as a function of time would result. In this manner the use of higher erase voltage and lower read voltage accelerates leakage and enhances the detectability of a defective cell. It is recommended for optimal performance, to keep definite relation between voltages applied to the erase gate 28 and the coupling gate 26 during the erase and the read operations so that the voltage on the floating gate 24 during the read operation and, in particular, the read current from the memory cell 10 would be same as in the method of the prior art during read operation, $\Delta Veg = (\Delta Vcge - \Delta Vcgr)*CRcg/(1-CReg)$, where $\Delta Veg$ is the difference between voltage that is applied to the erase gate 28 in the method of present invention during the erase operation and "normal" erase voltage, $\Delta Vcge$ is the difference between voltage which is applied to the coupling gate 26 in the method of present invention during the erase operation and voltage which is applied to the coupling gate 26 in the method of the prior art during the erase operation, $\Delta Vcgr$ is the difference between voltage which is applied to the coupling gate 26 in the method of present invention during the read operation and "normal" read voltage, CReg is evaluated coupling ratio between the erase gate 28 and the floating gate 24, CRcg is evaluated coupling ratio between the coupling gate 26 and the floating gate 24. In particular, if ground voltage is applied to the coupling gate 26 during the erase operation, $\Delta Veg = -\Delta Vcgr*CRcg/(1-CReg)$. Thus, with the method of the present invention, after a memory cell 10 is erased by a voltage greater than the "normal" erase voltage, the memory cell 10 is subject to a single high temperature bake, and is then tested for the data retention of the memory cell 10 based upon the single high temperature bake. If the read current from the tested memory cell 10 is lower than the reference current, then the memory cell 10 is deemed to be defective. Thus, with the method of the present invention, only a single high temperature bake process needs to be applied and the data retention of the memory cell 10 may be tested.

It has been found that the method of the present invention to test the data retention of a memory cell 10 may also be applied for a programmed state. Thus, a memory cell 10 to be tested for data retention is first programmed with coupling gate programming voltage which is greater than the "normal" coupling gate programming voltage. After the memory cell 10 is over-programmed, a higher voltage than "normal" may be applied to the coupling gate 26 to sense the read current. The increase in the read current is faster when the voltage on the floating gate 24 is more negative Because of this phenomenon, by over-programming the memory cell 10 and baking the memory cell 10, the read current of memory cell that has a leakage from floating gate 24 may increase substantially such that it would be above the read reference current, and the memory cell 10 that has a leakage from floating gate is then detectable. In this manner it improves the detectability of a defective memory cell 10. It has been found that for optimal performance, the increase in programming voltage should be equal to the increase in read voltage. Thus, with the method of the present invention, after a memory cell 10 is programmed with a voltage greater than the "normal" programming voltage, the memory cell 10 is subject to a single high temperature bake, and is then tested for the data retention of the memory cell 10 based upon the single high temperature bake. If the read current from the tested memory cell 10 is higher than the read reference current, then the memory cell 10 is deemed to be defective. Thus, with the method of the present invention, only a single high temperature bake process need to be applied and the data retention of the memory cell 10 may be tested.

There are a number of ways to implement the method of the present invention. First, the over-erase or over-program voltage can be externally supplied to the test die containing the memory cells 10 of interest. However, this may necessitate an extra pin to the die in the event the over-erase voltage or the over-program voltage is supplied on a dedicated pin. Alternatively, if the over-erase voltage or the over-program voltage is supplied on a pin to which other power/signal sources are also multiplexed, then this may necessitate additional circuitry within the die to distinguish between the over-erase voltage or the over-program voltage from the other power/signal.

Another way to implement the method of the present invention is to generate the over-erase voltage or the over-program voltage internally on the die. Virtually all floating gate non-volatile memory cells have an on-board charge pump to generate the high voltage required for "normal" erase or programming functions. To implement the method of the present invention, the on-board charge pump may be changed to generate an over-erase voltage or an over-program voltage.

From the foregoing it can be seen that with the method of the present invention, testing for data retention may be accomplished much faster than with the method of the prior art. In particular, the present invention reduces the testing time and improves screening efficiency. As noted above, with the present invention in which an over-erase or over-programming voltage is used, the absolute value of the potential on the floating gate during the baking process is higher, resulting in an acceleration of leakage, which results in a more efficient data retention screening.

What is claimed is:

1. A method of testing a non-volatile memory cell having a floating gate for the storage of charges thereon, wherein said method for testing the memory cell in the event the memory cell has a leakage current from the floating gate which is dependent upon the absolute value of the voltage of the floating gate, wherein said cell is characterized by a first erase voltage, a first programming voltage and a first read voltage, applied during normal operation, and a first read current of an erased memory cell, detected during normal operation, wherein said method comprising:
   applying a voltage greater than the first erase voltage to over erase the floating gate;
   subjecting the memory cell including the floating gate to a single high temperature bake; and
   testing the data retention of the floating gate by applying a read voltage lower than the first read voltage.

2. The method of claim 1 wherein said memory cell is characterized by:
   a single crystalline substrate of a first conductivity type and having a top surface;
   a first region of a second conductivity type in said substrate along the top surface;
   a second region of the second conductivity type, in said substrate along the top surface, spaced apart from the first region;
   a channel region between the first region and the second region;
   a word line gate positioned over a first portion of the channel region, spaced apart from the channel region by a first insulating layer;
   a floating gate positioned over another portion of the channel region, adjacent to and separated from the word line gate, wherein the floating gate is separated from the channel region by a second insulating layer;
   a coupling gate positioned over the floating gate and insulated therefrom by a third insulating layer; and
   an erase gate, positioned adjacent to the floating gate and on a side opposite to the word line gate; said erase gate positioned over the second region and is insulated therefrom.

3. The method of claim 2 wherein said testing step determines the memory cell is defective in the event the read current of the memory cell after said subjecting step is lower than a read reference current.

4. A method of testing a non-volatile memory cell having a floating gate for the storage of charges thereon, wherein said method for testing the memory cell in the event the memory cell has a leakage current from the floating gate which is dependent upon the absolute value of the voltage of the floating gate, wherein said cell is characterized by a first erase voltage, a first programming voltage and a first read voltage, applied during normal operation, and a first read current of a programmed memory cell, detected during normal operation, wherein said method comprising:
   applying a voltage greater than the first programming voltage to over program the floating gate;
   subjecting the memory cell including the floating gate to a single high temperature bake; and
   testing the data retention of the floating gate by applying a read voltage greater than the first read voltage.

5. The method of claim 4 wherein said memory cell is characterized by:
   a single crystalline substrate of a first conductivity type and having a top surface;
   a first region of a second conductivity type in said substrate along the top surface;

a second region of the second conductivity type, in said substrate along the top surface, spaced apart from the first region;

a channel region between the first region and the second region;

a word line gate positioned over a first portion of the channel region, spaced apart from the channel region by a first insulating layer;

a floating gate positioned over another portion of the channel region, adjacent to and separated from the word line gate, wherein the floating gate is separated from the channel region by a second insulating layer;

a coupling gate positioned over the floating gate and insulated therefrom by a third insulating layer; and an erase gate, positioned adjacent to the floating gate and on a side opposite to the word line gate; said erase gate positioned over the second region and is insulated therefrom.

6. The method of claim 5 wherein said testing step determines the memory cell is defective in the event the read current of the memory cell after said subjecting step is higher than a read reference current.

* * * * *